United States Patent
Fujimoto et al.

(10) Patent No.: US 9,414,487 B2
(45) Date of Patent: Aug. 9, 2016

(54) METAL PASTE COMPOSITION

(75) Inventors: Nobutaka Fujimoto, Himeji (JP); Tomoki Kawakita, Himeji (JP); Ryou Miyabara, Himeji (JP); Masami Nakamoto, Osaka (JP); Toshinobu Ohno, Osaka (JP); Mari Yamamoto, Osaka (JP); Yukiyasu Kashiwagi, Osaka (JP)

(73) Assignees: SUMITOMO SEIKA CHEMICALS CO., LTD., Hyogo (JP); OSAKA MUNICIPAL TECHNICAL RESEARCH INSTITUTE, Osaka (JP)

( * ) Notice: Subject to any disclaimer, the term of this patent is extended or adjusted under 35 U.S.C. 154(b) by 0 days.

(21) Appl. No.: 14/005,618

(22) PCT Filed: Mar. 6, 2012

(86) PCT No.: PCT/JP2012/055706
§ 371 (c)(1),
(2), (4) Date: Sep. 17, 2013

(87) PCT Pub. No.: WO2012/128028
PCT Pub. Date: Sep. 27, 2012

(65) Prior Publication Data
US 2014/0008588 A1 Jan. 9, 2014

(30) Foreign Application Priority Data
Mar. 18, 2011 (JP) ................. 2011-061139

(51) Int. Cl.
| | | |
|---|---|---|
| H01B 1/22 | (2006.01) |
| C08K 5/109 | (2006.01) |
| H05K 1/09 | (2006.01) |
| C08K 5/3415 | (2006.01) |
| C08K 3/08 | (2006.01) |

(52) U.S. Cl.
CPC ............... *H05K 1/092* (2013.01); *C08K 5/109* (2013.01); *C08K 5/3415* (2013.01); *H01B 1/22* (2013.01); *H05K 1/095* (2013.01); *C08K 3/08* (2013.01)

(58) Field of Classification Search
CPC .............. H01B 1/22; C08K 3/00; C08K 5/05; C08K 5/109; C08K 5/3415; C08L 69/00
USPC ....................................................... 252/514
See application file for complete search history.

(56) References Cited

U.S. PATENT DOCUMENTS

| | | | | |
|---|---|---|---|---|
| 4,665,136 A * | 5/1987 | Santangelo | .......... | C08G 64/323 525/523 |
| 2007/0102676 A1* | 5/2007 | Lee et al. | ..................... | 252/500 |
| 2012/0164777 A1 | 6/2012 | Kleine Jaeger et al. | | |

FOREIGN PATENT DOCUMENTS

| | | | | |
|---|---|---|---|---|
| CN | 101062974 A | 10/2007 | | |
| JP | 4-268382 A | 9/1992 | | |
| JP | 5-221760 A | 8/1993 | | |
| JP | 05-238858 A | 9/1993 | | |
| JP | 06-119808 | * 4/1994 | ............... | H01B 1/16 |
| JP | 08-148028 A | 6/1996 | | |
| JP | 10199334 | * 7/1998 | | |
| JP | 2006-160934 A | 6/2006 | | |
| JP | 2006-278160 A | 10/2006 | | |
| JP | 2007-066824 A | 3/2007 | | |
| JP | 2007-193992 A | 8/2007 | | |
| JP | 2009-245648 A | 10/2009 | | |
| JP | 2010-138426 A | 6/2010 | | |
| JP | 2010-257958 A | 11/2010 | | |
| WO | 2008/133073 A1 | 11/2008 | | |
| WO | 2011/004730 A1 | 1/2011 | | |
| WO | 2011/026769 A1 | 3/2011 | | |

OTHER PUBLICATIONS

"Physical Properties of Aliphatic Polycarbonates Made from CO2 and Epoxides". Thorat et al. Journal of Applied Polymer Science, vol. 89, 1163-1176 (2003). 14 total pages.*
Notification of Transmittal of Copies of Translation of the International Preliminary Report on Patentability form PCT/IB/338 dated Oct. 3, 2013 of International Application No. PCT/JP2012/055706 with forms PCT/IB/326, PCT/IB/373 and PCT/ISA/237, w/English translation.
International Search Report dated Jun. 19, 2012, issued in corresponding application No. PCT/JP2012/055706.
Written Opinion dated Jun. 19, 2012, issued in corresponding application No. PCT/JP2012/055706.
Office Action dated Apr. 9, 2015, issued in corresponding Chinese Patent Application No. 201280014092.8 (6 pages).
Office Action dated Feb. 9, 2016, issued in counterpart Japanese Application No. 2013-505874. (2 pages).
Office Action dated May 10, 2016, issued in counterpart Japanese Patent Application No. 2013-505874. (3 pages).
English translation of Office Action dated May 10, 2016, issued in counterpart Japanese Patent Application No. 2013-505874. (3 pages).

* cited by examiner

*Primary Examiner* — Mark Kopec
*Assistant Examiner* — Danny N Kang
(74) *Attorney, Agent, or Firm* — Westerman, Hattori, Daniels & Adrian, LLP

(57) ABSTRACT

The present invention provides a metal paste composition which can obtain the calcined bodies having low volume resistivity in a wiring substrate after calcining. More specifically, the present invention provides a metal paste composition comprising a metal, an aliphatic polycarbonate, and an organic solvent.

6 Claims, No Drawings

METAL PASTE COMPOSITION

TECHNICAL FIELD

The present invention relates to a metal paste composition.

BACKGROUND ART

In recent years, wiring substrates have been produced by using metal paste compositions on an insulating substrate to prepare a wiring pattern, and calcining the compositions at a higher temperature.

A variety of metal paste compositions have been examined, and for example, a metal paste composition in which a metal is combined with ethyl cellulose (see Patent Document 1), and a metal paste in which a metal is combined with an acrylic resin (see Patent Document 2), have been proposed.

REFERENCE DOCUMENTS

Patent Documents

Patent Document 1: JP H08-148028 A
Patent Document 2: JP H05-238858 A

SUMMARY OF THE INVENTION

Problems to be Solved by the Invention

There is a problem that the metal paste compositions described in the above-mentioned reference documents have high volume resistivity of a calcined body (wiring) after calcining.

An object of the present invention is to provide a metal paste composition which can obtain a calcined body having low volume resistivity in a wiring substrate after calcining.

Means for Solving the Problems

The present invention relates to a metal paste composition as shown below. Namely, the present invention relates to:

Item 1. A metal paste composition comprising a metal, an aliphatic polycarbonate, and an organic solvent.

Item 2. The metal paste composition according to Item 1, wherein the aliphatic polycarbonate is an aliphatic polycarbonate in which an epoxide and carbon dioxide are polymerized.

Item 3. The metal paste composition according to Item 1 or 2, wherein the aliphatic polycarbonate is at least one selected from the group consisting of polyethylene carbonate and polypropylene carbonate, Item 4. The metal paste composition according to any one of Items 1 to 3, wherein the amount of the aliphatic polycarbonate used is 0.001 to 10 parts by mass based on 100 parts by mass of the metal, Item 5. The metal paste composition according to any one of Items 1 to 4, wherein the metal is at least one selected from the group consisting of gold, silver, platinum, and an alloy thereof, Item 6. The metal paste composition according to any one of Items 1 to 5, wherein the organic solvent is at least one selected from the group consisting of α-terpineol, N-methyl-2-pyrrolidone, and propylene carbonate.

Item 7. The metal paste composition according to any one of Items 1 to 6, wherein the amount of organic solvent used is 0.001 to 50 parts by mass based on 100 parts by mass of the metal.

Effects of the Invention

According to the present invention, a metal paste composition can be provided which can obtain a calcined body having low volume resistivity in a wiring substrate after calcining.

Mode for Carrying Out the Invention

The metal paste composition according to the present invention is a metal paste composition comprising a metal, an aliphatic polycarbonate, and an organic solvent.

Examples of the metal to be used in the metal paste composition include, but not particularly limited to, gold, silver, copper, nickel, platinum, palladium, lead, titanium, barium, boron, and an alloy thereof. Among the metals, gold, silver, platinum, and an alloy thereof are suitably used, from the viewpoints that they are excellent in heat resistance and are hard to be oxidized in the air, thereby can be calcined in the presence of oxygen upon calcining the metal paste composition obtained, and the above aliphatic polycarbonate is decomposed uniformly, and that a calcined body having low volume resistivity is obtainable. In addition, these metals may be used alone respectively or in combination of two or more kinds thereof.

Although the shape of the above-mentioned metal is not particularly limited, powders are preferred from the viewpoint that the metal exists uniformly in the metal paste composition.

When the above-mentioned metal is in powder form, its median particle size is preferably 0.01 to 200 μm, and more preferably 0.05 to 100 μm.

In the present invention, the median particle size of the metal is a value measured by a laser analysis scattering method, and can be measured, for example, with LASER DIFFRACTION PARTICLE SIZE ANALYZER (manufactured by Shimadzu Corporation; product name: SALD-200) and the like.

For the purpose of adjusting volume resistivity in a range without inhibiting an effect of the present invention, a metal oxide such as mullite ($3Al_2O_3.2SiO_2$ to $2Al_2O_3.SiO_2$), alumina ($Al_2O_3$), zirconia ($ZrO_2$), barium titanate ($BaTiO_3$), lead zirconate titanate ($Pb(Zr,Ti)O_3$), cordierite ($2MgO.2Al_2O_3.5SiO_2$), barium borosilicate, iron silicate, rutile ($TiO_2$), spinel ($Al_2O_3.MgO$), sillimanite ($Al_2O.SiO_4$), magnesia (MgO), zircon ($ZrO_2.SiO_2$), steatite ($MgO.SiO_2$), forsterite ($2MgO.SiO_2$), ferrite ($M^{2+}O.Fe_2O_3$ wherein M=Mn, Fe, Co, Ni, Cu, Zn, Mg, Cd or the like), glass-ceramic materials and the like, can be added to the metal paste composition according to the present invention.

Examples of the aliphatic polycarbonate to be used in the metal paste composition include, but not particularly limited to, those in which an epoxide and carbon dioxide are polymerized.

Examples of the above-mentioned epoxide are not limited particularly if they are epoxides which are polymerized with carbon dioxide to become an aliphatic polycarbonate having a structure with the aliphatic polycarbonate in its main chain, and include ethylene oxide, propylene oxide, 1-butene oxide, 2-butene oxide, isobutylene oxide, 1-pentene oxide, 2-pentene oxide, 1-hexene oxide, 1-octene oxide, 1-decene oxide, cyclopentene oxide, cyclohexene oxide, styrene oxide, vinyl cyclohexene oxide, 3-phenyl propylene oxide, 3,3,3-trifluoropropylene oxide, 3-naphthyl propylene oxide, 3-phenoxy propylene oxide, 3-naphthoxy propylene oxide, butadiene mono-oxide, 3-vinyloxy propylene oxide, and 3-trimethylsilyloxy propylene oxide. Among these epoxides, ethylene oxide and propylene oxide are suitably used from the viewpoint of having high polymerization reactivity with carbon dioxide. In addition, these epoxides may be used alone respectively or in a combination of two or more kinds thereof.

The number average molecular weights of the above-mentioned aliphatic polycarbonate is preferably 5,000 to 1,000,000, and more preferably 10,000 to 500,000. When the number average molecular weight of the aliphatic polycarbonate is less than 5,000, the viscosity of the obtainable metal paste composition is low, and thereby there is a possibility that a blot may occur when a wiring substrate is prepared. When the number average molecular weight of the aliphatic polycarbonate exceeds 1,000,000, there is a possibility that its handling properties become worse since the solubility of the aliphatic polycarbonate to the above-mentioned solvent is reduced. The number average molecular weight is the value measured by the below-mentioned method.

The amount of the above-mentioned aliphatic polycarbonate to be used is preferably 0.001 to 10 parts by mass, more preferably 0.01 to 10 parts by mass, and still more preferably 0.1 to 10 parts by mass based on 100 parts by mass of the above-mentioned metal. When the amount of the aliphatic polycarbonate to be used is less than 0.001 parts by mass, the viscosity of the obtainable metal paste composition is low, and there is a possibility that a blot occurs upon preparing a wiring substrate. When the amount of the aliphatic polycarbonate to be used exceeds 10 parts by mass, the gas (carbon dioxide etc.) generated by decomposition of an excess aliphatic polycarbonate increases upon calcining the obtainable metal paste composition, and thereby there is a possibility that a dense calcined body is hard to be obtained.

Examples of the method for producing the above-mentioned aliphatic polycarbonate include a method of carrying out the polymerization reaction of the above-mentioned epoxide with the carbon dioxide in the presence of a metal catalyst.

Examples of the above-mentioned metal catalyst include an aluminum catalyst, and a zinc catalyst. Among them, a zinc catalyst is preferably used and an organic zinc catalyst is preferably used among the zinc catalyst since they have a high polymerization activity in the polymerization reaction of the epoxide with the carbon dioxide.

Examples of the above-mentioned organic zinc catalyst include organic zinc catalysts such as zinc acetate, diethyl zinc, dibutyl zinc and the like; and organic zinc catalysts which are obtainable by reacting a zinc compound with a compound such as a primary amine, a divalent phenol, a divalent aromatic carboxylic acid, an aromatic hydroxy acid, an aliphatic dicarboxylic acid, an aliphatic monocarboxylic acid and the like. Among these organic zinc catalysts, organic zinc catalysts are preferred which are obtainable by reacting a zinc compound, an aliphatic dicarboxylic acid and an aliphatic monocarboxylic acid since they have a higher polymerization activity.

The present specification explains in more detail the organic zinc catalysts obtainable by reacting a zinc compound, an aliphatic dicarboxylic acid and an aliphatic monocarboxylic acid, as an example of the embodiment of the organic zinc catalyst.

Embodiments of the above-mentioned zinc compound include inorganic zinc compounds such as zinc oxide, zinc hydroxide, zinc nitrate, zinc carbonate and the like; and organic zinc compounds such as zinc acetate, diethyl zinc, dibutyl zinc and the like. Among these zinc compounds, zinc oxide and zinc hydroxide are suitably used from the viewpoint that an organic zinc catalyst having a high catalyst activity can be obtained. In addition, these zinc compounds may be used alone respectively or in combination of two or more kinds thereof.

Embodiments of the above-mentioned aliphatic dicarboxylic acid include malonic acid, succinic acid, glutaric acid, adipic acid, and sebacic acid. Among these aliphatic dicarboxylic acids, glutaric acid and adipic acid are suitably used from the viewpoint that an organic zinc catalyst having high activity can be obtained. In addition, these aliphatic dicarboxylic acids may be used alone respectively or in combination of two or more kinds thereof.

The rate of the above-mentioned aliphatic dicarboxylic acid to be used is preferably 0.1 to 1.5 mol, and more preferably 0.5 to 1.0 mol based on 1 mol of the above-mentioned zinc compound. When the rate of the aliphatic dicarboxylic acid to be used is less than 0.1 mol, there is a possibility that a reaction with a zinc compound is hard to proceed. When the rate of the aliphatic dicarboxylic acid to be used exceeds 1.5 mol, there is also a possibility that the rate has no effect matched with it on activity of the obtainable organic zinc catalyst and becomes less economical.

Embodiments of the above-mentioned aliphatic monocarboxylic acid include formic acid, acetic acid, and propionic acid. Among these aliphatic monocarboxylic acids, formic acid and acetic acid are suitably used from the viewpoint that an organic zinc catalyst having high activity can be obtained. In addition, these aliphatic monocarboxylic acids may be used alone respectively or in combination of two or more kinds thereof.

The rate of the above-mentioned aliphatic monocarboxylic acid to be used is preferably 0.0001 to 0.1 mol, and more preferably 0.001 to 0.05 mol based on 1 mol of the above-mentioned aliphatic dicarboxylic acid. When the rate of the aliphatic monocarboxylic acid to be used is less than 0.0001 mol, there is a possibility that the obtainable organic zinc catalyst becomes an organic zinc catalyst having low activity since the organic zinc catalyst has a structure where the carboxylic acid group was contained in the terminal. When the rate of the aliphatic monocarboxylic acid to be used exceeds 0.1 mol, there is also a possibility that the rate has no effect matched with it on activity of the obtainable organic zinc catalyst and becomes less economical.

The method for reacting the above-mentioned zinc compound, the aliphatic dicarboxylic acid, and the aliphatic monocarboxylic acid is not particularly limited, and may be one where these may be reacted simultaneously, or where one of the aliphatic dicarboxylic acid and the aliphatic monocarboxylic acid is reacted with a zinc compound prior to a subsequent reaction of the reaction product with the other.

Upon reacting the above-mentioned zinc compound, the aliphatic dicarboxylic acid, and the aliphatic monocarboxylic acid, the solvent for preparing a metal catalyst may be used from the viewpoint that the reaction is carried out smoothly. Examples of the above-mentioned solvent for preparing a metal catalyst are not particularly limited if the solvent does not inhibit the reaction, and include aromatic hydrocarbon solvents such as benzene, toluene, xylene and the like; ether solvents such as diethylether, tetrahydrofuran, dioxane and the like; carbonate solvents such as dimethyl carbonate, diethyl carbonate, propylene carbonate and the like; and acetonitrile, dimethylformamide, dimethyl sulfoxide, and hexamethyl phosphotriamide. Among these solvents for preparing a metal catalyst, aromatic hydrocarbon solvents such as benzene, toluene, xylene and the like, are suitably used from the viewpoint that a recycling of the solvent for preparing a metal catalyst is easy. The amount to be used of the solvent for preparing a metal catalyst is preferably 500 to 10000 parts by mass based on 100 parts by mass of the zinc compound from the viewpoint that its reaction is carried out smoothly.

The reaction temperature upon reacting the above-mentioned zinc compound, the aliphatic dicarboxylic acid, and the aliphatic monocarboxylic acid, is not particularly limited, and is preferably 20 to 110° C., and more preferably 50 to 100° C. Since the reaction time varies with the reaction temperature, the reaction time cannot generally be defined. However, it is preferred that the reaction time is usually 1 to 20 hours.

The thus obtainable organic zinc catalyst can be used for the polymerization reaction in which the epoxide and carbon dioxide are reacted by isolating the organic zinc catalyst in usual methods after completion of the above-mentioned reaction, or by keeping the organic zinc catalyst in the reaction liquid without isolating the catalyst.

For example, in use of the above-mentioned organic zinc catalyst, it is preferred to fully remove moisture with a possibility of having a harmful influence on the reaction of the epoxide and carbon dioxide upon using the catalyst in the state where the above-mentioned reaction liquid contains the catalyst without isolation.

The amount of the above-mentioned metal catalyst to be used for the polymerization reaction is preferably 0.001 to 20 parts by mass, and more preferably 0.01 to 10 parts by mass based on 100 parts by mass of the epoxide. When the amount of the metal catalyst to be used is less than 0.001 parts by mass, there is a possibility that a polymerization reaction is hard to proceed. When the amount of the metal catalyst to be used exceeds 20 parts by mass, there is also a possibility that the amount has no effect matched with it and becomes less economical.

The reaction solvent to be used if needed in the above-mentioned polymerization reaction is not particularly limited, and various organic solvents can be used as the solvent. Examples of the above-mentioned organic solvent specifically include aliphatic hydrocarbon solvents such as pentane, hexane, octane, decane, cyclohexane and the like; aromatic hydrocarbon solvents such as benzene, toluene, xylene and the like; halogenated hydrocarbon solvents such as chloromethane, methylene dichloride, chloroform, carbon tetrachloride, 1,1-dichloroethane, 1,2-dichloroethane, ethyl chloride, trichloroethane, 1-chloropropane, 2-chloropropane, 1-chlorobutane, 2-chlorobutane, 1-chloro-2-methylpropane, chlorobenzene, bromobenzene and the like; and carbonate solvents such as dimethyl carbonate, diethyl carbonate, propylene carbonate and the like.

The amount of the above-mentioned reaction solvent to be used is preferably 500 to 10000 parts by mass based on 100 parts by mass of the epoxide from the viewpoint that its reaction is carried out smoothly.

In the above-mentioned polymerization reaction, examples of a method for reacting the epoxide with carbon dioxide in the presence of a metal catalyst include, but not particularly limited to, a method for reacting them, e.g., by providing the above-mentioned epoxide, the metal catalyst, and an optional reaction solvent to an autoclave, mixing them and then pressing carbon dioxide into the autoclave.

The pressure of carbon dioxide to be used in the above-mentioned polymerization reaction is not particularly limited to, and is preferably 0.1 to 20 MPa, more preferably 0.1 to 10 MPa, and still more preferably 0.1 to 5 MPa. When the pressure of carbon dioxide to be used exceeds 20 MPa, there is also a possibility that the pressure has no effect matched with it and becomes less economical.

The above-mentioned polymerization reaction temperature is not particularly limited to, and is preferably 30 to 100° C., and more preferably 40 to 80° C. When the polymerization reaction temperature is less than 30° C., there is a possibility that a polymerization reaction needs a long time. When the polymerization reaction temperature exceeds 100° C., a side reaction also occurs and there is a possibility that its yield decreases. Since the polymerization reaction time varies with the polymerization reaction temperature, the reaction time cannot generally be defined. However, it is preferred that the reaction time is usually 2 to 40 hours.

After completion of the polymerization reaction, the resultant reaction product is filtered out by means of filtration, optionally washed with solvents and the like, and subsequently dried to be able to obtain an aliphatic polycarbonate.

Examples of the organic solvent to be used for the metal paste composition according to the present invention include, but not particularly limited to, α-terpineol, N-methyl-2-pyrrolidone, isopropyl alcohol, diethylene glycol monobutyl ether acetate, diethylene glycol monobutyl ether, toluene, cyclohexane, methyl ethyl ketone, dimethyl carbonate, diethyl carbonate, and propylene carbonate. Among these organic solvents, α-terpineol, N-methyl-2-pyrrolidone, and propylene carbonate are suitably used from the viewpoints that their boiling points are suitably high, and evaporation at room temperature is less and that the organic solvent can be removed uniformly upon calcining the metal paste composition to be obtained.

The amount of the above-mentioned organic solvent to be used is 0.001 to 50 parts by mass, preferably 0.01 to 50 parts by mass, and more preferably 0.1 to 50 parts by mass based on 100 parts by mass of the above-mentioned metal. When the amount of the organic solvent to be used is less than 0.001 parts by mass, there is a possibility that the mobility of the metal paste composition obtainable becomes low, and the dispersibility of the metal may decrease. When the amount of the organic solvent to be used exceeds 50 parts by mass, there is a possibility that the viscosity of the metal paste composition obtainable becomes low, the liquid lappet at the time of wiring, the blot at the time of printing and the like arise, and thereby its handing becomes difficult.

The method of producing the metal paste composition according to the present invention include, but not particularly limited to, a method of stirring each component of the metal, the aliphatic polycarbonate, and the organic solvent by using any conventionally known stirring method, and the like.

Examples of the above-mentioned known stirring method include a method for kneading the components by means of rotation and vibration with devices such as a mill and the like filled up with ceramic balls and the like; and a method for kneading using a mortar.

The metal paste composition according to the present invention can be thus obtained.

Handling for the metal paste composition according to the present invention is easy, and the composition can further contain a dispersing agent, a plasticizer and the like optionally from the viewpoint of obtaining the metal paste composition having easy handling and excellent dispersibility of metals.

Examples of the above-mentioned dispersing agent include polyhydric alcohol esters such as glycerin, sorbitan and the like; polyether polyols such as diethylene glycol, triethylene glycol, dipropyrene glycol, tripropylene glycol, polyethylene glycol, polypropylene glycol and the like; amines such as polyethyleneimine and the like; (meth)acrylic resins such as polyacrylic acid, polymethacrylic acid and the like; copolymers of isobutylene or styrene, and a maleic anhydride; and amine salts thereof.

The amount of the above-mentioned dispersing agent to be used is preferably 15 parts by mass or less, and more preferably 10 parts by mass or less based on 100 parts by mass of the above-mentioned metal.

Examples of the above-mentioned plasticizer include polyether polyols, and phthalate esters.

The amount of the above-mentioned plasticizer to be used is preferably 15 parts by mass or less, and more preferably 10 parts by mass or less based on 100 parts by mass of the above-mentioned metal.

Although use of the metal paste composition of the present invention is not particularly limited, it can be used, for example, as a material for forming an electric conduction layer of solar cell elements.

The above-mentioned method for forming an electric conduction layer of solar cell elements is not particularly limited, and examples thereof include a method comprising forming various layers required each for the surface or the back of a semiconductor substrate consisting of silicon and the like to obtain a laminate, applying a metal paste composition of the present invention on the above-mentioned laminate to dry and then calcine them.

When the metal paste composition according to the present invention was calcined, the reason is unclear why a calcined body having low volume resistivity is produced. However, the inventors suppose that the reason is based on the followings, namely: aliphatic polycarbonates have good thermal decomposition property, and can decompose at a lower temperature upon calcining. As the result, since aggregation of metals is suppressed and metals are uniformly distributed, the inventors consider that a calcined body having low volume resistivity is made.

EXAMPLES

Herein below, the present invention will be specifically described with Production Examples, Examples and Comparative Examples, but the present invention is in no way limited to these Examples.

Evaluations

The number average molecular weight of aliphatic polycarbonates obtained by Production Examples, and the thickness and volume resistivity of calcined bodies obtained using the metal paste compositions obtained by Examples and Comparative Examples, were measured and evaluated by the following methods:

(1) Number Average Molecular Weight of Aliphatic Polycarbonates

A chloroform solution in which the concentration of an aliphatic polycarbonate is 0.5 mass %, was prepared and measured with a high-speed liquid chromatograph. After the measurement, its number average molecular weight was calculated by comparing with a polystyrene having a known number average molecular weight, which was measured on the same conditions.

The measurement conditions are also as follows:
Model: HLC-8020
Column: GPC column (TOSOH CORP.; product name: TSK GEL Multipore HXL-M)
Column temperature: 40° C.
Elution liquid: Chloroform
Flow rate: 1 mL/min.

(2) Thickness of Calcined Bodies Using Metal Paste Compositions

A slide glass (width: 26 mm, length: 76 mm, thickness: 1 mm) was prepared as an insulating substrate, and washed with acetone. Then, a surface treatment of the slide glass was performed using a UV-ozone treatment instrument (manufactured by SEN Lights Corporation; product name: Desktop-type Photo Surface Processor Model: PL16-110) to prepare a slide glass for tests.

A masking tape was used in the slide glass for tests, a rectangular (10 mm×50 mm) pattern was formed on the slide glass to pour a metal paste composition into the pattern. The masking tape was removed after the application, and the composition was dried at 25° C. for 240 minutes. Five applied products were prepared in the same method.

The temperature of the obtained application products was increased from 25° C. to 150° C., 200° C., 250° C., 300° C., or 350° C. in 10 minutes by using Desktop type electric muffle furnace (manufactured by EYELA; product name: KDF S90). After holding for 30 minutes at the above-mentioned temperatures, air cooling was carried out to 25° C. to obtain calcined bodies.

The thickness of the obtained calcined bodies was measured by using a thickness measurement device (manufactured by Kosaka Laboratory Ltd.; product name: Microfigure Measuring Instrument surfcorder ET3000i).

(3) Volume Resistivity of Calcined Bodies Using Metal Paste Compositions

Volume resistivity of the obtained calcined bodies was measured by using a resistivity meter (manufactured by Mitsubishi Chemical, Inc.; product name: Loresta-EP MCP-T360). In addition, volume resistivity was automatically calculated by inputting the thickness of the above-mentioned calcined bodies into the above-mentioned resistivity meter.

Production Example 1

Production of Organic Zinc Catalyst

In a 300 mL volumetric four-necked flask equipped with a stirrer, a nitrogen gas introducing tube, a thermometer, and a reflux condenser tube, 8.1 g (100 mmol) of zinc oxide, 12.7 g (96 mmol) of glutaric acid, 0.1 g (2 mmol) of acetic acid, and 130 g (150 mL) of toluene were charged. Next, after replacing the atmosphere in the reaction system by a nitrogen atmosphere, its temperature was increased to 55° C., and stirred at the same temperature for 4 hours to react them. Then, after the temperature was increased to 110° C., the reactant was stirred at the same temperature for 4 hours and azeotropically dehydrated. After removing only its moisture, the reactant was cooled to room temperature to obtain a reaction liquid containing the organic zinc catalyst.

A part of the reaction liquid was collected to measure IR (Thermo-Nicolet Japan, Inc.; product name: AVATAR 360) for the organic zinc catalyst obtained by a filtration. As the result, the peak based on a carboxylic acid group was not observed.

Production Example 2

Production of Polypropylene Carbonate

After replacing in advance the atmosphere in the system of 1 L-volumetric autoclave equipped with a stirrer, a gas introducing tube, and a thermometer by a nitrogen atmosphere, 8.0 mL of a reaction liquid (containing 1.0 g of the organic zinc catalyst) obtained by the same method as Production Example 1, 131 g (200 mL) of hexane, and 46.5 g (0.80 mol) of propylene oxide were charged in the autoclave. Next, carbon dioxide was added to them while stirring, the atmosphere in the reaction system was replaced by a carbon dioxide atmosphere, and filled up with carbon dioxide to 1.5 MPa. Then, its temperature was increased to 60° C. to perform the polymerization reaction for 6 hours, while supplying carbon dioxide consumed by the reaction.

After completion of the reaction, the autoclave was cooled and depressured, and then the reactant was filtered and dried under reduced pressure to obtain 80.8 g of polypropylene carbonate.

The obtained polypropylene carbonate could be identified from having the following physical properties.

IR(KBr): 1742, 1456, 1381, 1229, 1069, 787
(all units are $cm^{-1}$)

The number average molecular weight of the obtained polypropylene carbonate was 52,000.

Production Example 3

Production of Polyethylene Carbonate

In a manner similar to that in Production Example 2 except that 35.2 g (0.80 mol) of ethylene oxide was used in place of 46.5 g (0.80 mol) of propylene oxide in Production Example 2, 68.4 g of polyethylene carbonate was obtained.

The obtained polyethylene carbonate could be identified from having the following physical properties.

IR(KBr): 1740, 1447, 1386, 1217, 1029, 785
(all units are $cm^{-1}$)

The number average molecular weight of the obtained polyethylene carbonate was 47,500.

Example 1

In a 5 mL volumetric eggplant type flask, 0.12 g of a polypropylene carbonate obtained by the same method as that of Production Example 2, and 0.88 g of N-methyl-2-pyrrolidone were charged and the polypropylene carbonate was dissolved to obtain 1.00 g of a uniform solution.

In a mortar, 4.0 g of silver particles (manufactured by DAIKEN CHEMICAL Industries, brand name: S-211, median particle size: 0.311 μm) was weighted, and the total amount of the above-mentioned solution was slowly added while stirring to obtain 4.98 g of a metal paste composition.

The measurement results of thickness and volume resistivity of the obtained metal paste composition were shown in Table 1 and Table 2.

Example 2

In a manner similar to that in Example 1 except that 0.12 g of polyethylene carbonate was used in place of 0.12 g of polypropylene carbonate in Example 1, 4.97 g of a metal paste composition was obtained.

The measurement results of thickness and volume resistivity of the obtained metal paste composition were shown in Table 1 and Table 2.

Comparative Example 1

In a manner similar to that in Example 1 except that 0.12 g of ethyl cellulose (manufactured by Nisshin Kasei Co., Ltd.; product name: Ethocell 45) was used in place of 0.12 g of polypropylene carbonate in Example 1, 4.98 g of a metal paste composition was obtained.

The measurement results of thickness and volume resistivity of the obtained metal paste composition were shown in Table 1 and Table 2.

Comparative Example 2

In a manner similar to that in Example 1 except that 0.12 g of an acrylic resin (manufactured by Aldrich Co., Ltd., brandname: Polymethyl methacrylate, Weight-average molecular weight: about 120,000) was used in place of 0.12 g of polypropylene carbonate in Example 1, 4.99 g of a metal paste composition was obtained.

The measurement results of thickness and volume resistivity of the obtained metal paste composition were shown in Table 1 and Table 2.

TABLE 1

Measurement items Thickness [mm]

| | Calcining temperatures | | | | |
|---|---|---|---|---|---|
| | 150° C. | 200° C. | 250° C. | 300° C. | 350° C. |
| Example 1 | 6.27E−02 | 1.08E−01 | 9.91E−02 | 5.36E−02 | 6.27E−02 |
| Example 2 | 9.65E−02 | 7.33E−02 | 9.41E−02 | 7.12E−02 | 8.16E−02 |
| Comparative Example 1 | 5.56E−02 | 4.16E−02 | 6.34E−02 | 7.48E−02 | 5.53E−02 |
| Comparative Example 2 | 5.12E−02 | 6.50E−02 | 6.69E−02 | 3.13E−02 | 4.29E−02 |

TABLE 2

Measurement items Volume Resistivity [Ω · cm]

| | Calcining temperatures | | | | |
|---|---|---|---|---|---|
| | 150° C. | 200° C. | 250° C. | 300° C. | 350° C. |
| Example 1 | 1.77E−04 | 6.95E−06 | 6.25E−06 | 5.30E−06 | 3.70E−06 |
| Example 2 | 2.85E−04 | 4.35E−06 | 4.70E−06 | 5.50E−06 | 4.75E−06 |
| Comparative Example 1 | 2.12E+03 | 1.15E−02 | 5.25E−06 | 4.60E−06 | 5.25E−06 |
| Comparative Example 2 | 3.30E−04 | 1.76E−05 | 4.30E−06 | 3.05E−06 | 3.55E−06 |

From Table 1, it was observed that all of the calcined bodies prepared using the metal paste compositions obtained in Examples and Comparative Examples, could be prepared in an equivalent thickness.

From Table 2, it was observed that the calcined bodies having low volume resistivity was obtained from the metal paste compositions obtained in the Examples, in particular, when the compositions were calcined at a lower temperature of 200° C. or less.

INDUSTRIAL APPLICABILITY

According to the present invention, the metal paste composition can be provided which can obtain the calcined body having low volume resistivity in a wiring substrate after calcining.

The invention claimed is:
1. A metal paste composition comprising a metal, an aliphatic polycarbonate, and an organic solvent,
   wherein the aliphatic polycarbonate is an aliphatic polycarbonate in which an epoxide and carbon dioxide are polymerized, and the metal is at least one selected from the group consisting of gold, silver, copper, nickel, platinum, palladium, lead, titanium, barium, boron, and an alloy of two or more kinds thereof.

2. The metal paste composition according to claim 1, wherein the aliphatic polycarbonate is at least one selected from the group consisting of polyethylene carbonate and polypropylene carbonate.

3. The metal paste composition according to claim 1, wherein the amount of the aliphatic polycarbonate used is 0.001 to 10 parts by mass based on 100 parts by mass of the metal.

4. The metal paste composition according to claim 1, wherein the metal is at least one selected from the group consisting of gold, silver, platinum, and an alloy thereof.

5. The metal paste composition according to claim 1, wherein the organic solvent is at least one selected from the group consisting of α-terpineol, N-methyl-2-pyrrolidone, and propylene carbonate.

6. The metal paste composition according to claim 1, wherein the amount of organic solvent used is 0.001 to 50 parts by mass based on 100 parts by mass of the metal.

* * * * *